(12) United States Patent
Lin

(10) Patent No.: US 6,570,809 B1
(45) Date of Patent: May 27, 2003

(54) REAL-TIME MULTITASKING FLASH MEMORY WITH QUICK DATA DUPLICATION

(75) Inventor: Ching-Yuan Lin, Hsin-Chu Hsien (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/063,387

(22) Filed: Apr. 17, 2002

(51) Int. Cl.$^7$ ................................................. G11C 8/00
(52) U.S. Cl. ........................ 365/230.02; 365/189.02
(58) Field of Search ...................... 365/189.02, 230.02, 365/185.11

(56) References Cited

U.S. PATENT DOCUMENTS 6,279,069 B1 * 8/2001 Robinson et al. ........... 711/103
6,282,145 B1 * 8/2001 Tran et al. ............. 365/230.06
6,288,724 B1 * 9/2001 Kumar et al. ................ 345/621

OTHER PUBLICATIONS

Betty Prince, "Semiconductor Memories", 1983, Wiley, $2^{nd}$ edition, pp. 170–171.*

* cited by examiner

*Primary Examiner*—M. Tran
(74) *Attorney, Agent, or Firm*—Winston Hsu

(57) ABSTRACT

A flash memory device that is capable of quick data duplication by utilizing a plurality of memory sections. The memory sections each include an address multiplexer, a data multiplexer, and a page buffer. Data is duplicated by using a control logic to control the multiplexers allowing data to be copied from a source page buffer to one or more target page buffers via a second address bus and a second data bus.

20 Claims, 2 Drawing Sheets

REAL-TIME MULTITASKING FLASH MEMORY WITH QUICK DATA DUPLICATION

BACKGROUND OF INVENTION

1. Field of the Invention

The present invention relates to a flash memory device, and more particularly, to a flash memory device with quick data duplication.

2. Description of the Prior Art

Portable electronic products are widely popular among consumers. Portable electronic products including digital cameras, cellular phones, video game systems, and personal digital assistants use flash memory devices to store data. As a result, flash memory technology is constantly improving because of the demands of consumers for portable electronic products.

Flash memory uses a non-volatile memory structure, and controls a threshold voltage of a memory cell to store binary data such as a "0" or a "1". A key design feature of flash memory is that the data stored is not lost when the power supply is shut down.

The complex nature of programming and erasing flash memory devices leads to a major challenge. Specifically, the write access of flash memory is not as fast as the read access. The time-consuming write access decreases the overall efficiency of the flash memory device. In addition, conventional flash memory devices typically do not allow a processor to issue a read operation command while a program or an erase operation is executed. In most implementations, the processor is required to periodically monitor the status register of the flash memory device to detect the end of a program or an erase operation before initiating a read operation command.

Prior art systems may employ multiple flash memory devices in an attempt to prevent the above defect. In such systems, the processor usually issues a read operation command to one of the flash memory devices while other flash memory devices are undergoing program or erase operations. However, such systems typically suffer from high costs because multiple flash memory devices are implemented even though the capacity of a single flash memory device may adequately accommodate the needs of the particular electronic device.

Please refer to FIG. 1, which is a block diagram of a prior art flash memory device 10. The flash memory device 10 has a plurality of memory sections 12, 14 (only two memory sections are shown for clarity), and a controller 16. The memory sections 12, 14 are respectively associated with status registers 18, 20, sense amplifiers 22, 24, charge pump circuits 26, 28, X-decoders 30, 32, and Y-decoders 34, 36. The memory sections 12, 14 each have a plurality of memory cells arranged in a matrix format for storing binary data. The controller 16 controls the operation of the flash memory device 10 via communication with a processor of an application system. The status registers 18, 20 store the current status (programming, reading, or erasing) of each memory section 12, 14. The sense amplifiers 22, 24 are used for amplifying signals read from the memory cells of the memory sections 12, 14 to determine the binary data stored in the corresponding memory cells. The charge pump circuits 26, 28 are used to provide the voltage levels needed for reading, programming or erasing the memory sections 12, 14. The X-decoders 30, 32 and the Y-decoders 34, 36 enable a selection of a specific memory cell within the memory sections 12, 14 of the flash memory device 10.

Multiple X-decoders and Y-decoders permit simultaneous access to more than one memory section 12, 14. For example, while the memory section 12 is being erased, the memory section 14 may be simultaneously read. When the memory sections 12, 14 are required to store the same inputted data, the controller 16 will output the data once to each of the memory sections 12, 14. For example, the controller 16 outputs a first address data and the associated input data to the X-decoder 30, Y-decoder 34, and charge pump circuit 26 at time T0. Then, the controller 16 outputs a second address data and the same input data to the X-decoder 32, Y-decoder 36, and charge pump circuit 28 at time T0+dT. The flash memory device 10 has only one port for receiving data transmitted from an application system and one buffer for storing the input data temporarily. The delay time dT is required because the identical input data is transmitted to individual memory sections 12, 14 from the same buffer. Similarly, when the data stored in the memory section 12 is required to be copied to the memory section 14, the data must first be retrieved from the memory section 12, and then be outputted to a buffer. The data stored in the buffer will then be written into the memory section 14 after a new writing procedure is executed.

The performance of the flash memory device 10 is affected by repeatedly executing identical operations to achieve the purpose of data duplication. This duplication of data causes overall performance to be poor because of the lengthy data transmission between the memory sections.

SUMMARY OF INVENTION

It is therefore a primary objective of the claimed invention to provide a flash memory device with quick data duplication to solve the above-mentioned problem.

Briefly, the claimed invention provides a flash memory device having a control logic for controlling programming, erasing, and reading operations of the flash memory device, a data input buffer for storing input data, a first data bus for transferring the input data received from the data input buffer, and a plurality of memory sections. Each memory section has a plurality of memory cells arranged in a matrix format for storing binary data, a page buffer for temporarily storing data which will be written into a corresponding memory cell, and a data multiplexer connected to the page buffer, the first data bus and a second data bus. The data multiplexer is used for selecting a transmitting path between the page buffer and the first data bus or between the page buffer and the second data bus. When the input data stored in a memory section is to be duplicated into another memory section, each of data multiplexers corresponding to the two memory sections will select a transmitting path between a corresponding page buffer and the second data bus to allow the input data to be duplicated through the second data bus.

It is an advantage of the claimed invention that the flash memory device can directly duplicate data between page buffers. Both the transmitting paths and the time required for transmitting data from one memory section to other memory sections are shortened.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
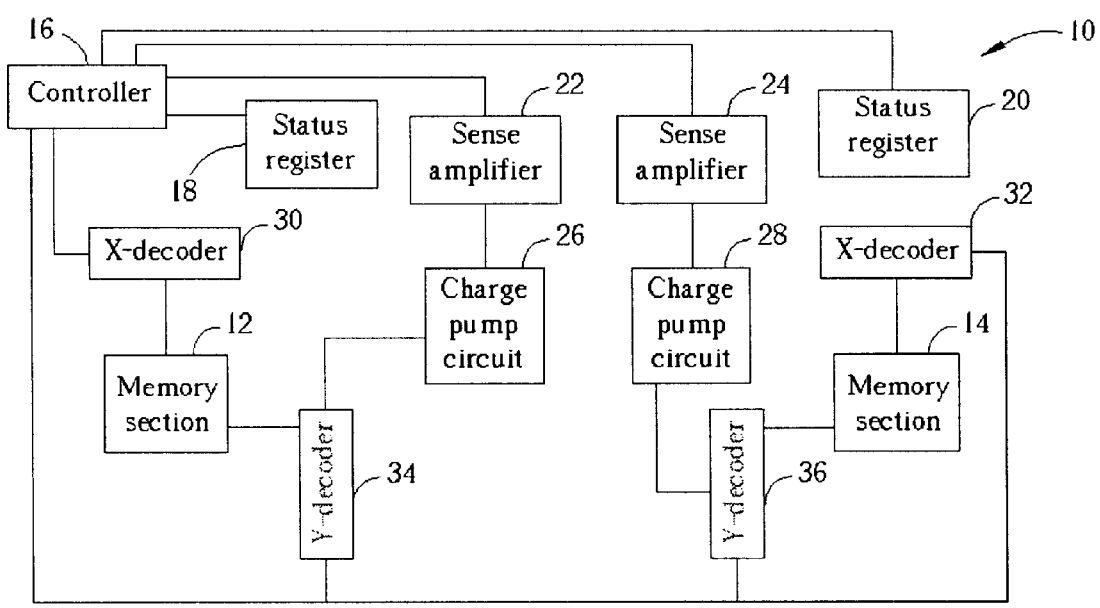
FIG. 1 is a block diagram of a prior art flash memory device.
Figure 2:
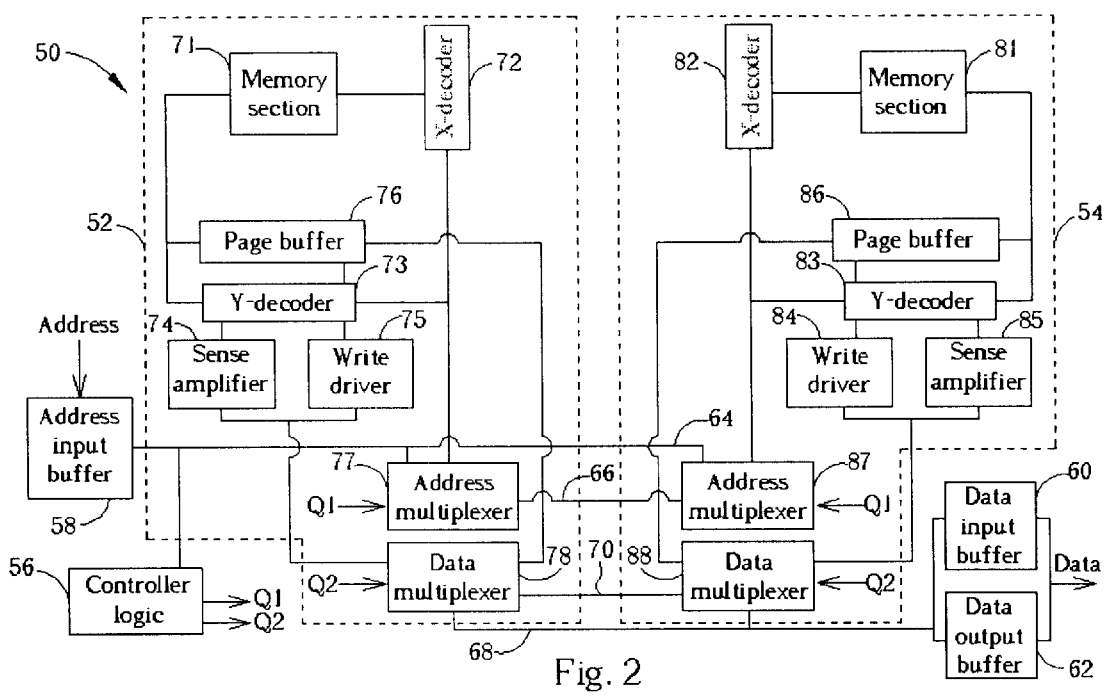
FIG. 2 is a block diagram of a flash memory device according to the present invention.

Please refer to FIG. 2, which is a block diagram of a flash memory device 50 according to the present invention. The flash memory device 50 comprises two memory banks 52, 54, a control logic 56, an address input buffer 58, a data input buffer 60, a data output buffer 62, a first address bus 64, a second address bus 66, a first data bus 68, and a second data bus 70. Please note that for clarity only two memory banks 52, 54 are shown in FIG. 2. In actuality, the flash memory device 50 has a plurality of memory sections. In other words, the flash memory device 50 is not limited to include only two memory sections, and can be expanded to include N (N is a positive integer) memory sections. Also note that the flash memory device 50 further comprises charge pump circuits for providing required voltages to execute programming or erasing operations on the memory cells.

The memory bank 52 has a memory section 71, an X-decoder 72, a Y-decoder 73, a sense amplifier 74, a write driver 75, a page buffer 76, an address multiplexer 77, and a data multiplexer 78. The memory bank 54 is identical to the memory bank 52 having a memory section 81, an X-decoder 82, a Y-decoder 83, a sense amplifier 84, a write driver 85, a page buffer 86, an address multiplexer 87, and a data multiplexer 88. The memory sections 71, 81 each have a plurality of memory cells arranged in a matrix format for storing binary data. The control logic 56 controls operations of the flash memory device 50 such as programming, reading, or erasing. The address input buffer 58 is used for temporarily storing address data inputted from an application device, and transmitting the address data via the first address bus 64. The data input buffer 60 is used for temporarily storing data inputted from the application device and then outputting the data via the first data bus 68. The data output buffer 62 is used for temporarily storing data outputted via the first data bus 68, and then transmitting the data to the application device. The X-decoders 72, 82 and Y-decoders 73, 83 are used for selecting the memory cells of the memory sections 71, 81 according to the address data. The page buffers 76, 86 are used for temporarily storing data that will be written into the memory sections 71, 81. The sense amplifiers 74, 84 are used for detecting the binary data stored in the memory sections 71, 81. The write drivers 75, 85 are used for handling writing operation to store data in the memory sections 71, 81. The address multiplexers 77, 87 are used for selecting a transmitting path between the address decoders (X-decoders 72, 82 and Y-decoders 73, 83) and the first address bus 64 or the address decoders and the second address bus 66 by a control signal Q1 generated from the control logic 56. Similarly, the data multiplexers 78, 88 are used for selecting a transmitting path between the page buffers 76, 86 and the first data bus 68 or the page buffers 76, 86 and the second data bus 70 by a control signal Q2 generated from the control logic 56. The operation of the flash memory device 50 is further described as follows.

During the normal programming operation, the address multiplexers 77, 87 select a transmitting path between the address decoders (X-decoders 72, 82 and Y-decoders 73, 83) and the first address bus 64. The data multiplexers 78, 88 select a transmitting path between the page buffers 76, 86 and the first data bus 68. When a first piece of data is to be stored in the memory section 71 and a second piece of data is to be stored in the memory section 81, the address data individually associated with the first and second pieces of data are stored in the address input buffer 58 for selecting the corresponding memory sections 71, 81. The address data associated with the first piece of data is then transmitted via the first address bus 64, and is further decoded by the X-decoder 72 and Y-decoder 73 to enable the memory section 71. The first piece of data is outputted from the data input buffer 60, is transmitted via the first data bus 68, and is received by the write driver 75 because the memory section 71 is enabled. The write driver 75 stores the first piece of data temporarily in the page buffer 76, and then controls the page buffer 76 to write the first piece of data to the memory section 71. Similarly, the address data associated with the second piece of data is transmitted via the first address bus 64, and is further decoded by the X-decoder 82 and Y-decoder 83 to enable the memory section 81. The second piece of data is outputted from the data input buffer 60, is transmitted via the first data bus 68, and is received by the write driver 85 because the memory section 81 is enabled. The write driver 85 stores the second piece of data temporarily in the page buffer 86, and then controls the page buffer to write the second piece of data into the memory section 81 whether the first piece of data is being written into the memory section 71 or is already recorded in the memory section 71.

The erasing operation is similar to the programming operation except that the voltage levels applied to the memory cells of the memory sections 71, 81 are different. Regarding the reading operation, the data stored in the memory section 71 is retrieved according to associated address selected by the X-decoder 72 and the Y-decoder 73. The sense amplifier 74 then detects the data retrieved from the memory section 71, determines the binary values of the data, and outputs the results ("0"s and "1"s) to the data output buffer 62 via the first data bus 68.

If data is required to be duplicated between the memory sections 71, 81, the flash memory device 50 discloses an improved architecture to accelerate data duplication speed. For example, the source data stored in the memory section 71 will be copied to the memory section 81 when the application device issues a copy command. First, the source data is retrieved from the memory section 71, and is temporarily stored in the corresponding page buffer 76. Then, the control logic 56 controls the address multiplexers 77, 87 and data multiplexers 78, 88 to change the corresponding transmitting paths. Specifically, the address multiplexers 77, 87 select the transmitting paths between the address decoders (X-decoders 72, 82 and Y-decoders 73, 83) and the second address bus 66, and the data multiplexers 78, 88 select the transmitting paths between the page buffers 76, 86 and the second data bus 70. According to the copy command issued by the application device, the control logic 56 determines the duplication source (memory section 71) and the duplication target (memory section 81). The control logic 56 sends address data associated with the duplication source and the duplication target to the corresponding address decoders via the second address bus 66. The memory section 81 will be notified by the control logic 56 that data stored in the page buffer 76 is ready to be copied. The data stored in the page buffer 76 is then transmitted to the page buffer 86 via the second data bus 70. Finally, the write driver 85 of the memory section 54 writes the data stored in the page buffer 86 to the corresponding memory section 81 to complete the data duplication.

When identical data inputted by the application device is to be stored in both memory sections 71, 81, the data duplication method used is similar to the previously mentioned operation. The address data associated with the inputted data is first transmitted via the first address bus 64 to the X-decoder 72 and the Y-decoder 73 as usual, and the inputted data is accordingly transmitted via the first data bus 68 to the page buffer 76. Then, the control logic controls the address multiplexers 77, 87 and data multiplexers 78, 88 to change the corresponding transmitting paths. Specifically, the address multiplexers 77, 87 select the transmitting paths between the address decoders (X-decoders 72, 82 and Y-decoders 73, 83) and the second address bus 66, and the data multiplexers 78, 88 select the transmitting paths between the page buffers 76, 86 and the second data bus 70. The control logic 56 determines the duplication source (memory section 71) and the duplication target (memory section 81). The control logic 56, accordingly, sends address data associated with the duplication source and the duplication target to the corresponding address decoders via the second address bus 66. The address data associated with the duplication source identifies the location of the input data, that is, the memory section 71. Similarly, the address data associated with the duplication target identifies the location to which the input data is to be copied, that is, the memory section 81. The input data stored in the page buffer 76 of the memory section 71 is then copied and transmitted to the page buffer 86 of the memory section 81 via the second data bus 70. The data stored in the page buffers 76, 86 is identical because of data duplication, and the memory sections 71, 81, therefore, will both record the same input data.

The flash memory device 50 is not limited to comprise only two memory sections.

A plurality of memory sections each with individual address multiplexers and data multiplexers will function in accordance with the data duplication operations detailed above to achieve fast duplication performance, with less time being spent on data transmission.

In contrast to the prior art flash memory device, the flash memory device according to the present invention has an address multiplexer and a data multiplexer for each memory section. When a copy command for duplicating data is performed on a group of or on all of the memory sections, the address multiplexer and data multiplexer of each related memory section are controlled by the control logic to make specific address bus and data bus connections between the related memory sections. This results in the page buffers of the related memory sections being connected to each other. The data duplication is performed quickly as all the page buffers of the related memory sections have the same data provided by the one source memory section through the same data bus. There are no repeated writing operations performed to duplicate data. In summary, the writing speed of the flash memory device according to the present invention is improved, with respect to the prior art, by utilizing direct connections between page buffers.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A flash memory device comprising:
   a control logic for controlling programming, erasing, and reading operations of the flash memory device;
   a data input buffer for storing an input data;
   a first data bus electrically connected to the data input buffer for transferring the input data received from the data input buffer; and
   a plurality of memory banks, each memory bank comprising
   a plurality of memory cells arranged in a matrix format for storing the input data;
   a page buffer for temporarily storing the input data which will be written into a corresponding memory cell; and
   a data multiplexer electrically connected to the page buffer, the first data bus and a second data bus for selecting a transmitting path between the page buffer and the first data bus or between the page buffer and the second data bus;
   wherein when the input data stored in one of the memory banks is to be duplicated into another one of the memory banks, the two data multiplexers respectively corresponding to the two memory banks select a transmitting path between a corresponding page buffer and the second data bus to allow the input data to be duplicated through the second data bus.

2. The flash memory device of claim 1 wherein each memory bank further comprises an address decoder for selecting the memory cells, and an address multiplexer electrically connected to the address decoder for transmitting a first address data or a second address data to the address decoder.

3. The flash memory device of claim 2 further comprising an address input buffer for receiving the first address data, a first address bus electrically connected to address multiplexers of the memory banks for transmitting the first address data, and a second address bus electrically connected to the control logic and the address multiplexers of the memory banks for transmitting the second address data generated by the control logic.

4. The flash memory device of claim 3 wherein each address multiplexer is used for selecting a transmitting path between a corresponding address decoder and the first address bus or between the address decoder and the second address bus.

5. The flash memory device of claim 4 wherein when the input data stored in a memory bank is to be duplicated into another memory bank, each of address multiplexers corresponding to the two memory banks will select a transmitting path between a corresponding address decoder and the second address bus to allow the second address data to be transferred through the second address bus.

6. The flash memory device of claim 3 wherein the address decoder comprises an X-decoder and a Y-decoder for selecting word lines and bit lines associated with the memory cells according to the first or second address data.

7. The flash memory device of claim 1 wherein the memory banks are capable of being written, read, or erased simultaneously.

8. The flash memory device of claim 1 wherein each of the memory banks further comprises a sense amplifier for detecting the input data stored in each memory cell and outputting a detecting result to a data output buffer of the flash memory device via the first data bus.

9. The flash memory device of claim 1 wherein each of the memory banks further comprises a write driver for receiving the input data transmitted from the data multiplexer and writing the input data into the page buffer.

10. The flash memory device of claim 9 wherein the write driver comprises a charge pump circuit for providing a plurality of voltage levels.

11. A flash memory device comprising:
    a control logic for controlling programming, erasing, and reading operation of the flash memory device;
    an address input buffer for receiving first address data;
    a first address bus electrically connected to the address input buffer for transferring the first address data; and a plurality of memory banks, each memory bank comprising:
- a plurality of memory cells arranged in a matrix format for storing binary data;
- an address decoder for selecting the memory cells; and
- an address multiplexer electrically connected to the address decoder, the first address bus, and a second address bus for selecting a transmitting path between the address decoder and the first address bus or between the address decoder and the second address bus;
- wherein when an input data stored in one of the memory banks is to be duplicated into another one of the memory banks, the two address multiplexers respectively corresponding to the two memory banks select a transmitting path between the corresponding address decoder and the second address bus to allow a second address data generated by the control logic to be transferred through the second address bus.

12. The flash memory device of claim 11 wherein the memory bank further comprises a page buffer for temporarily storing the input data which will be written into a corresponding memory cell, and a data multiplexer electrically connected to the page buffer for transmitting the input data.

13. The flash memory device of claim 12 further comprising a data input buffer for storing the input data which will be stored in the flash memory device, a first data bus electrically connected to the page buffer and the data input buffer for transmitting the input data, and a second data bus electrically connected to the page buffers of the memory banks for transmitting the input data.

14. The flash memory device of claim 13 wherein the data multiplexer is used for selecting a transmitting path between the page buffer and the first data bus or between the page buffer and the second data bus.

15. The flash memory device of claim 14 wherein when the input data stored in a memory bank is to be duplicated into another memory bank, each of data multiplexers corresponding to the two memory banks will select a transmitting path between a corresponding page buffer and the second data bus to allow the input data to be duplicated through the second data bus.

16. The flash memory device of claim 11 wherein the address decoder comprises an X-decoder and a Y-decoder for selecting word lines and bit lines associated with the memory cells according to the first or second address data.

17. The flash memory device of claim 11 wherein the memory banks are capable of being written, read, or erased simultaneously.

18. The flash memory device of claim 11 wherein the memory bank further comprises a sense amplifier for detecting the data stored in each memory cell and outputting a detecting result to a data output buffer of the flash memory device via the first data bus.

19. The flash memory device of claim 11 wherein the memory bank further comprises a write driver for receiving the data transmitted from the data multiplexer and writing the data into the page buffer.

20. The flash memory device of claim 19 wherein the write driver comprises a charge pump circuit for providing a plurality of voltage levels.

* * * * *